US012782425B2

(12) United States Patent
Yamada et al.

(10) Patent No.: US 12,782,425 B2
(45) Date of Patent: Nov. 3, 2026

(54) TEMPERATURE ADJUSTMENT SYSTEM AND ELECTRONIC COMPONENT TESTING APPARATUS

(71) Applicant: ADVANTEST Corporation, Tokyo (JP)

(72) Inventors: Yuya Yamada, Tokyo (JP); Guenther Jeserer, Amerang (DE)

(73) Assignee: ADVANTEST Corporation, Tokyo (JP)

( * ) Notice: Subject to any disclaimer, the term of this patent is extended or adjusted under 35 U.S.C. 154(b) by 182 days.

(21) Appl. No.: 18/708,854

(22) PCT Filed: Nov. 9, 2021

(86) PCT No.: PCT/JP2021/041224
§ 371 (c)(1),
(2) Date: May 9, 2024

(87) PCT Pub. No.: WO2023/084613
PCT Pub. Date: May 19, 2023

(65) Prior Publication Data

US 2025/0027988 A1 Jan. 23, 2025

(51) Int. Cl.
*G01R 31/28* (2006.01)

(52) U.S. Cl.
CPC ...... *G01R 31/2875* (2013.01); *G01R 31/2877* (2013.01)

(58) Field of Classification Search
CPC ............ G01R 31/2875; G01R 31/2877; G01R 1/0458; G01R 31/26; G01R 31/28;
(Continued)

(56) References Cited

U.S. PATENT DOCUMENTS 5,665,314 A 9/1997 Berger et al.
6,445,203 B1 9/2002 Yamashita et al.
(Continued)

FOREIGN PATENT DOCUMENTS

EP 3413061 A1 12/2018
GB 2495777 A 4/2013
(Continued)

OTHER PUBLICATIONS

Jerry I. Tustaniwskyj et al., "High Performance Active Temperature Control of a Device Under Test (DUT)", IEEE 2004 (6 pages).

*Primary Examiner* — Akm Zakaria
(74) *Attorney, Agent, or Firm* — Osha Bergman Watanabe & Burton LLP

(57) ABSTRACT

A temperature adjustment system for adjusting a temperature of a DUT electrically connected to a socket includes a first temperature adjustment device that supplies a fluid to an internal space in either the socket or a contact member that contacts the DUT when the DUT is pressed against the socket and a second temperature adjustment device that adjusts a temperature of an atmosphere in a chamber in which the socket and the contact member are disposed. The first temperature adjustment device includes a first supplier that supplies a first fluid and includes one or more connectors connected to one or more supply sources that supply the first fluid and a heat exchanger disposed between the one or more connectors and the internal space. The heat exchanger has a heat exchange part exposed in the chamber and exchanges heat between the first fluid and the atmosphere in the chamber.

13 Claims, 4 Drawing Sheets

(58) Field of Classification Search
CPC ............ G01R 31/2874; G01R 31/2601; G01R 31/2862; G01R 31/2863; G01R 31/2887
See application file for complete search history.

(56) References Cited

U.S. PATENT DOCUMENTS

| | | | | |
|---|---|---|---|---|
| 6,545,494 | B1 | 4/2003 | Olsen et al. | |
| 6,975,028 | B1 | 12/2005 | Wayburn et al. | |
| 8,653,843 | B2 | 2/2014 | Ando et al. | |
| 8,844,612 | B2 | 9/2014 | Tani et al. | |
| 10,753,971 | B2 | 8/2020 | Saito | |
| 2002/0050834 | A1 | 5/2002 | Olsen et al. | |
| 2003/0112025 | A1* | 6/2003 | Hamilton | G01R 31/2862 324/750.14 |
| 2007/0058350 | A1 | 3/2007 | Nakamura | |
| 2007/0267188 | A1 | 11/2007 | Di Stefano et al. | |
| 2009/0183866 | A1* | 7/2009 | Sakaue | G05D 23/1904 165/287 |
| 2010/0039117 | A1* | 2/2010 | Jacobs | G05D 23/1931 165/80.4 |
| 2010/0218692 | A1 | 9/2010 | Nakamura | |
| 2010/0224352 | A1 | 9/2010 | Stuckey et al. | |
| 2012/0313657 | A1 | 12/2012 | Nakamura | |
| 2015/0268295 | A1 | 9/2015 | Sasaki et al. | |
| 2019/0101587 | A1 | 4/2019 | Watanabe | |
| 2019/0204378 | A1* | 7/2019 | Gopal | G01R 31/2862 |
| 2020/0033402 | A1 | 1/2020 | Hashimoto et al. | |
| 2020/0241040 | A1 | 7/2020 | Yoshino et al. | |
| 2020/0241582 | A1 | 7/2020 | Sasaki et al. | |
| 2020/0371158 | A1 | 11/2020 | Kato et al. | |
| 2021/0063436 | A1 | 3/2021 | Tustaniwskyj | |
| 2023/0003786 | A1* | 1/2023 | Tustaniwskyj | G01R 31/2642 |
| 2023/0098042 | A1* | 3/2023 | Ouyang | B65G 47/905 324/750.13 |

FOREIGN PATENT DOCUMENTS

| | | | |
|---|---|---|---|
| JP | 2001-013201 | A | 1/2001 |
| JP | 2003-065943 | A | 3/2003 |
| JP | 2004-503924 | A | 2/2004 |
| JP | 2005-257372 | A | 9/2005 |
| JP | 2006-343174 | A | 12/2006 |
| JP | 2007-071806 | A | 3/2007 |
| JP | 2009-064830 | A | 3/2009 |
| JP | 2011-247784 | A | 12/2011 |
| JP | 2020-190520 | A | 11/2020 |
| KR | 10-2009-0077175 | A | 7/2009 |
| KR | 10-2009-0095456 | A | 9/2009 |
| KR | 10-1865067 | B1 | 6/2018 |
| WO | 2020/159954 | A1 | 8/2020 |

* cited by examiner

TEMPERATURE ADJUSTMENT SYSTEM AND ELECTRONIC COMPONENT TESTING APPARATUS

TECHNICAL FIELD

The present invention relates to a temperature adjustment system that adjusts a temperature of a device under test (hereinafter simply referred to as a "DUT") such as a semiconductor integrated circuit element in testing of the DUT, and an electronic component testing apparatus including the temperature adjustment system.

DISCUSSION OF THE BACKGROUND

A test system that controls a temperature of a DUT during testing by supplying gas (air) to the DUT (for example, see Patent Document 1 (paragraphs [0033]to [0035], FIG. 5)) has been known. This test system includes cooling means and heating means for adjusting a temperature of gas supplied to the DUT, and the cooling means and the heating means are controlled by a temperature controller. This temperature controller controls the cooling means and the heating means so that a temperature of the DUT is maintained at a desired set value based on a signal indicating a measured value of the temperature of gas input from an air temperature sensor.

PATENT DOCUMENT

Patent Document 1: JP 2004-503924 A

In the test system, when there is a large difference between a temperature of air taken in from an air intake port before temperature adjustment and a target temperature in air temperature adjustment, a large amount of energy is required for temperature adjustment.

SUMMARY

One or more embodiments provide a temperature adjustment system that can save energy in fluid temperature adjustment, and an electronic component testing apparatus including this temperature adjustment system.

A temperature adjustment system according to one or more embodiments is a temperature adjustment system for adjusting a temperature of a DUT electrically connected to a socket, the temperature adjustment system including a first temperature adjustment device configured to supply a fluid to an internal space included in the socket or a contact member contacting the DUT when the DUT is pressed against the socket, and a second temperature adjustment device configured to adjust a temperature of an atmosphere in a chamber in which the socket and the contact member are disposed, wherein the first temperature adjustment device includes a first supplier configured to supply a first fluid, the first supplier includes a first connector to which a first supply source for supplying the first fluid is connected, and a heat exchanger interposed between the first connector and the internal space, and the heat exchanger has a heat exchange part exposed in the chamber, and exchanges heat between the first fluid and the atmosphere in the chamber.

In one or more embodiments, the first supplier may include a temperature adjuster configured to adjust a temperature of the first fluid supplied from the first supply source via the first connector, and the heat exchanger may be disposed between the first connector and the temperature adjuster.

In one or more embodiments, the first supplier may include a measurement unit (example of a sensor) configured to measure a temperature of the first fluid on a downstream side of the temperature adjuster, and a controller configured to control the temperature adjuster based on a measurement result of the measurement unit.

In one or more embodiments, the temperature adjuster may include a heating unit (example of a heater) configured to heat the first fluid.

In one or more embodiments, the heat exchanger may include a plurality of fins exposed in the chamber, and a main body having a flow path, the fins being connected to the main body, the first fluid flowing through the flow path.

In one or more embodiments, the first connector may include a second connector (example of an air supply connector) connected to a second supply source (example of an air supply source) for supplying air, and a third connector (example of a nitrogen supply connector) connected to a third supply source (example of a nitrogen supply source) for storing liquid nitrogen and supplying nitrogen, the first supplier may include a junction where a first flow path connected to the second connector joins a second flow path connected to the third connector, and the first supplier may supply, as the first fluid, the air supplied from the second supply source, the nitrogen supplied from the third supply source, or a mixed fluid of the air and the nitrogen.

In one or more embodiments, the first connector may include a second connector (example of an air supply connector) connected to a second supply source (example of an air supply source) for supplying air, and the first supplier may supply the air supplied from the second supply source as the first fluid.

In one or more embodiments, the first connector may include a third connector (example of a nitrogen supply connector) connected to a third supply source (example of a nitrogen supply source) for storing liquid nitrogen and supplying nitrogen, and the first supplier may supply the nitrogen supplied from the third supply source as the first fluid.

In one or more embodiments, the first temperature adjustment device may include a second supplier configured to supply a second fluid having a temperature different from a temperature of the first fluid, and a mixer configured to mix the first fluid supplied from the first supplier and the second fluid supplied from the second supplier and to supply a mixed fluid to the internal space.

In one or more embodiments, the second fluid may be room temperature air.

In one or more embodiments, the second temperature adjustment device may include a heating device configured to heat the atmosphere inside the chamber, and/or a cooling device configured to cool the atmosphere inside the chamber.

An electronic component testing apparatus according to one or more embodiments is an electronic component testing apparatus for testing a DUT, the electronic component testing apparatus including a socket to which the DUT is electrically connected, a contact member contacting the DUT when the DUT is pressed against the socket, a chamber in which the socket and the contact member are disposed, and the temperature adjustment system, wherein a first temperature adjustment device of the temperature adjustment system supplies a fluid to an internal space of the socket or the contact member, and a second temperature adjustment device of the temperature adjustment system adjusts a temperature of an atmosphere inside the chamber.

In one or more embodiments, the socket may include a contactor electrically connected to a terminal of the DUT, and a housing holding the contactor, the internal space may be provided in the housing, and the contactor may be exposed inside the internal space.

According to a temperature adjustment system according to one or more embodiments, it is possible to save energy in temperature adjustment because heat of an atmosphere inside a chamber, a temperature of which has been adjusted by a second temperature adjustment device, can be used for a first temperature adjustment device.

DESCRIPTION OF THE EMBODIMENTS

Figure 1:
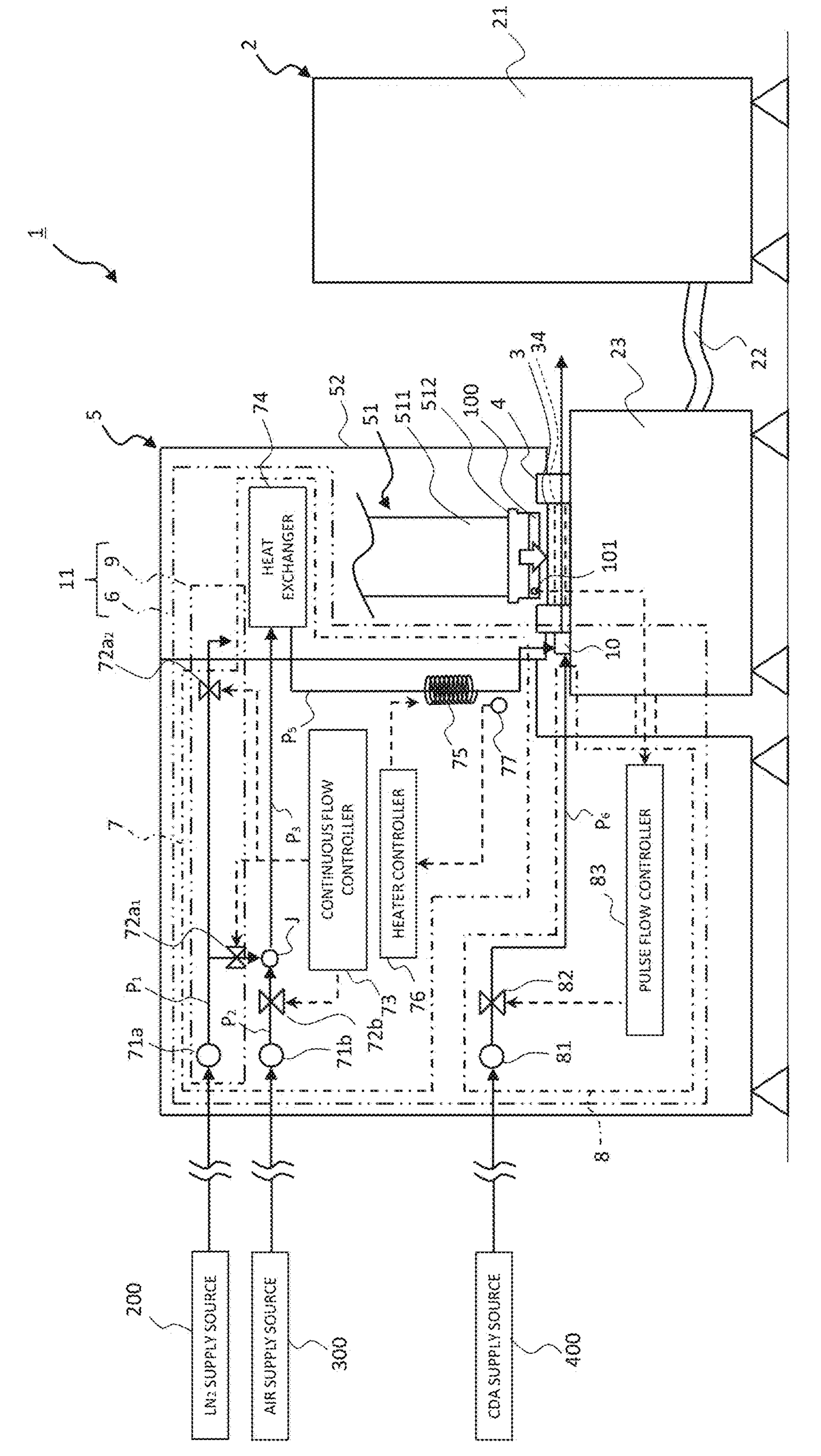
FIG. 1 is a block diagram illustrating an example of a configuration of an electronic component testing apparatus according to one or more embodiments.

Embodiments will be described below based on the drawings. FIG. 1 is a block diagram illustrating an example of a configuration of an electronic component testing apparatus in one or more embodiments.

An electronic component testing apparatus 1 illustrated in FIG. 1 is a device that tests electrical characteristics of a DUT 100 such as a semiconductor integrated circuit element. The electronic component testing apparatus 1 tests whether the DUT 100 operates properly while applying thermal stress of high temperature or low temperature to the DUT 100.

The electronic component testing apparatus 1 includes a tester 2, a socket 3, a socket guide 4, and a handler 5. The tester 2 executes testing to measure and evaluate electrical characteristics of the DUT 100. The tester 2 includes a tester main frame 21 and a test head 23 connected to the tester main frame 21 via a cable 22. The socket 3 is attached to an upper surface of the test head 23, and the socket guide 4 is disposed around the socket 3.

The handler 5 presses the DUT 100 against the socket 3 and electrically connects the DUT 100 and the socket 3 to each other. In this way, the DUT 100 and the test head 23 are electrically connected via the socket 3. Then, the tester 2 inputs a signal from the tester main frame 21 to the DUT 100 via the cable 22 and the test head 23, and measures and evaluates output of the DUT 100 based on the input signal.

An example of the DUT 100 to be tested is a SoC (System on a chip). However, the DUT 100 may also be a memory device, a logic device, etc. Further, the DUT 100 may be a resin-molded device in which a semiconductor chip is packaged with a molding material such as a resin material, or may be a bare die that is not packaged. Note that, when the type of DUT 100 is replaced, the socket 3 is replaced with a socket suitable for a shape of the DUT 100, the number of pins, etc.

Further, the DUT 100 in one or more embodiments includes a temperature detection circuit 101 that detects junction temperature. The temperature detection circuit 101 in one or more embodiments is, for example, a circuit including a thermal diode, and is formed on a semiconductor substrate. Note that the temperature detection circuit 101 is not limited to the thermal diode. For example, the temperature detection circuit 101 may be configured using an element having temperature-dependent resistance characteristics or bandgap characteristics, or a thermocouple may be embedded in the DUT 100 as the temperature detection circuit 101.

The handler 5 conveys the DUT 100 to the socket 3 and presses the DUT 100. This handler 5 has a contact arm 51 and a chamber 52. The contact arm 51 includes an arm 511 and a pusher 512. The arm 511 includes an actuator (not illustrated) for horizontal movement, and can move in every direction (XY directions) according to rails of this actuator. Furthermore, the arm 511 also includes an actuator (not illustrated) for vertical driving, and can move in a vertical direction (Z-axis direction). The pusher 512 is provided at a tip of the arm 511. This pusher 512 can contact and hold the DUT 100 by vacuum suction, etc.

The chamber 52 is a constant temperature bath made of a heat insulating material, etc. The chamber 52 is not easily affected by temperature changes from the surrounding environment, and thus can keep a temperature of an atmosphere inside the constant temperature bath constant. An upper part of the test head 23 enters the chamber 52 through an opening, and the socket 3 is disposed in the chamber 52.

In the handler 5, the DUT 100 is conveyed above the socket 3 located in the chamber 52 by horizontal movement of the arm 511 while being held by the pusher 512. Next, the DUT 100 is pressed against the socket 3 by lowering the arm 511. In this instance, the pusher 512 is located inside the chamber 52.

The handler 5 includes a temperature adjustment system 11. The temperature adjustment system 11 includes a socket temperature adjustment device 6 and a chamber temperature adjustment device 9. The socket temperature adjustment device 6 is a device that adjusts the temperature of the DUT 100 by supplying temperature-adjusted fluid to an internal space 34 of the socket 3. The socket temperature adjustment device 6 and the chamber temperature adjustment device 9 may constitute a part of the handler 5 as in one or more embodiments, or may be separate from the handler 5.

The socket temperature adjustment device 6 in one or more embodiments includes a continuous flow supplier 7, a pulse flow supplier 8, and a mixer 10.

The continuous flow supplier 7 is a mechanism that continuously supplies the mixer 10 with a heating fluid including a heated and temperature-adjusted refrigerant or hot medium. The refrigerant and the hot medium are used to adjust the temperature of the DUT 90. The hot medium is used in high temperature testing to test whether or not the DUT 100 operates properly at high temperatures. On the contrary, the refrigerant is used in low temperature testing to test whether or not the DUT 100 operates properly at low temperatures. In one or more embodiments, since the hot medium or the refrigerant is supplied to the socket 3, it is preferable to use gas as the hot medium and the refrigerant to protect the socket, a board of the test head, etc. Furthermore, gas is less prone to solidification and boiling unlike liquid, and thus can achieve a wide temperature range. In one or more embodiments, although not particularly limited, the case in which low-temperature gaseous nitrogen is used as the refrigerant and high-temperature air is used as the hot medium is illustrated.

The continuous flow supplier 7 includes a plurality of connectors 71*a* and 71*b*, flow paths $P_1$ to $P_5$, a plurality of valves 72*$a_1$*, 72*$a_2$*, and 72*b*, a continuous flow controller 73, a heat exchanger 74, a flow path heater 75, a heater controller 76, and a temperature sensor 77.

The connector 71*a* is connected to an $LN_2$ (liquid nitrogen) supply source 200 that stores liquid nitrogen and supplies low-temperature nitrogen. For example, the $LN_2$ supply source 200 includes a pressure vessel storing liquid nitrogen at high pressure or a connection port connected to a liquid nitrogen supply pipeline in a factory, and can send low-temperature gaseous nitrogen and/or liquid nitrogen to the connector 71*a*. The flow path $P_1$ that branches into two parts is connected to the connector 71*a*, and the branching parts of the flow path $P_1$ are connected to a junction J and the chamber 52, respectively. The valves 72*$a_1$* and 72*$a_2$* that adjust a flow rate of nitrogen supplied from the $LN_2$ supply source 200 are provided on the flow path $P_1$ that branches. The valve 72*$a_1$* adjusts the flow rate of nitrogen supplied to the junction J, while the valve 72*$a_2$* adjusts the flow rate of nitrogen supplied to the inside of the chamber 52.

The connector 71*b* is connected to an air supply source 300 that supplies air at room temperature. The air supply source 300 includes, for example, a pump that supplies outside air to the connector 71*b*. Existing factory piping, etc. may be used as the air supply source 300. The flow path $P_2$ is connected to the connector 71*b*, and a downstream side of the flow path $P_2$ merges with the flow path $P_1$ at the junction J. The valve 72*b* that adjusts the flow rate of air supplied from the air supply source 300 is provided on the flow path $P_2$.

The continuous flow controller 73 controls ON and OFF of opening and closing of the valves 72*$a_1$*, 72*$a_2$*, and 72*b*. When executing low temperature testing on the DUT 100, the continuous flow controller 73 opens the valves 72*$a_1$* and 72*$a_2$* that adjust the flow rate of nitrogen, and maintains the valve 72*b* that adjusts the flow rate of air in a closed state. That is, the continuous flow controller 73 controls the valves 72*$a_1$* and 72*$a_2$* so that nitrogen serving as a refrigerant is continuously supplied during low temperature testing.

On the other hand, when executing high temperature testing on the DUT 100, the valve 72*b* that adjusts the flow rate of air is opened, and the valves 72*$a_1$* and 72*$a_2$* that adjust the flow rate of nitrogen are maintained in closed states. That is, the continuous flow controller 73 controls the valve 72*b* so that air is continuously supplied during execution of high temperature testing.

Figure 2:
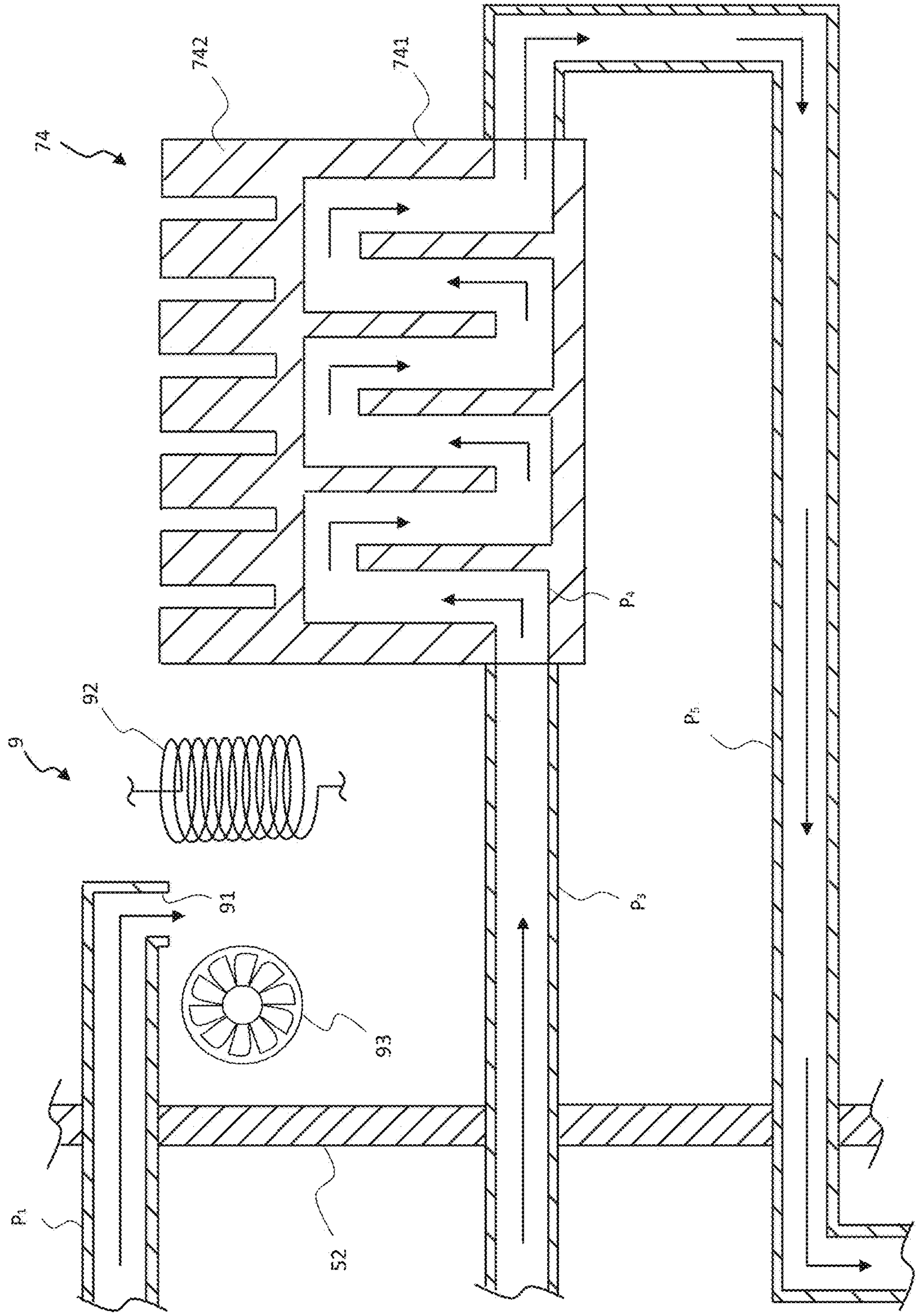
FIG. 2 is a cross-sectional view illustrating an example of an internal configuration of a chamber of the electronic component testing apparatus according to one or more embodiments.

FIG. 2 is a cross-sectional view illustrating an example of an internal configuration of the chamber 52 of the electronic component testing apparatus 1 according to one or more embodiments. As illustrated in FIGS. 1 and 2, the flow path $P_3$ is connected to the junction J, and a downstream side of the flow path $P_3$ is connected to the heat exchanger 74 inside the chamber 52. The heat exchanger 74 is provided inside the chamber 52 and performs heat exchange between a fluid supplied from the flow path $P_3$ and an atmosphere inside the chamber 52.

As illustrated in FIG. 2, the heat exchanger 74 has a main body 741 and a plurality of fins 742 formed on the main body 741. The flow path $P_4$ through which a fluid supplied from the flow path $P_3$ flows is formed inside the main body 741. The flow path $P_4$ extends from one end to the other end of the main body 741, and has a meandering linear shape so that the contact area with respect to the main body 741 is large. The fins 742 are provided to be exposed to the inside of the chamber 52, and when the surface area of the heat exchanger 74 is increased by the fins 742, heat exchange between the fluid flowing through the flow path $P_4$ and the atmosphere inside the chamber 52 can be performed efficiently.

The temperature of the atmosphere inside the chamber 52 is adjusted to a high or low temperature by the chamber temperature adjustment device 9. The chamber temperature adjustment device 9 includes the connector 71*a*, the valve 72*$a_2$*, the flow path $P_1$, a nitrogen supply port 91, a chamber heater 92, and a fan 93. That is, in one or more embodiments, the socket temperature adjustment device 6 and the chamber temperature adjustment device 9 share a part of the flow path $P_1$, the connector 71*a*, and the valve 72*$a_2$*.

The nitrogen supply port 91 is connected to connector 71*a* via the flow path $P_1$. The nitrogen supply port 91 lowers the temperature of the atmosphere inside the chamber 52 by supplying low-temperature nitrogen supplied from the $LN_2$ supply source 200 into the chamber 52. On the other hand, the chamber heater 92 heats the atmosphere inside chamber 52 to raise the temperature of the atmosphere.

The fan 93 circulates the atmosphere inside the chamber 52 by blowing air, thereby efficiently changing the temperature of the atmosphere. The fan 93 is provided to be located on an upstream side of the heat exchanger 74 in a flow of the circulating atmosphere, and can blow air to the heat exchanger 74. Further, in one or more embodiments, the heater 92 is located on an upstream side of the heat exchanger 74 and on a downstream side of the fan 93. Further, in one or more embodiments, the nitrogen supply port 91 is located on the upstream side of the heat exchanger 74 and on the downstream side of the fan 93.

When executing low temperature testing on the DUT 100, the chamber temperature adjustment device 9 supplies low-temperature nitrogen into the chamber 52 from the nitrogen supply port 91 while blowing air by the fan 93, thereby lowering the temperature of the atmosphere inside the chamber 52 to a target temperature. When the temperature of the atmosphere becomes lower than the target temperature, the atmosphere may be heated by the heater 92 as necessary.

In this instance, in one or more embodiments, during low temperature testing, the $LN_2$ supply source 200 supplies $LN_2$ to the socket temperature adjustment device 6. A set temperature of the atmosphere inside the chamber during low temperature testing is normally higher than the temperature of nitrogen flowing through the flow path $P_4$, and thus in one or more embodiments, nitrogen flowing through the flow path $P_4$ is heated by the heat exchanger 74.

Furthermore, when executing high temperature testing on the DUT 100, the chamber temperature adjustment device 9 raises the temperature of the atmosphere inside the chamber 52 to the target temperature using the heater 92 while blowing air using the fan 93. In one or more embodiments, the air supply source 300 supplies room temperature air to the socket temperature adjustment device 6 during high temperature testing. However, since the set temperature of the atmosphere inside the chamber during high temperature testing is higher than room temperature, the fluid flowing through the flow path $P_4$ will be heated by the heat exchanger 74 even when executing high temperature testing.

In this way, the temperature of the atmosphere inside the chamber 52 is set higher than the temperature of the fluid flowing through the flow path $P_4$ in both low temperature testing and high temperature testing, and thus the fluid flowing through the flow path $P_4$ is heated by heat exchange. In this way, by utilizing heat of the atmosphere inside the chamber 52 by the heat exchanger 74, it is possible to reduce the amount of fluid heating by the flow path heater 75.

The flow path $P_5$ is connected to the downstream side of the flow path $P_4$. As illustrated in FIG. 1, the flow path heater 75 is provided in the flow path $P_5$. The flow path heater 75 heats the fluid flowing through the flow path $P_5$. As described above, since the fluid heated by the flow path heater 75 has been previously heated by the heat exchanger 74, a heater having small output can be used as the flow path heater 75.

The heater controller 76 performs feedback control on the flow path heater 75. Specifically, the heater controller 76 PID-controls output of the flow path heater 75 based on a temperature measurement value of the temperature sensor 77 provided on the downstream side of the flow path heater 75 in the flow path $P_5$ so that a deviation between the temperature measurement value and the target temperature is reduced. The target temperature of the fluid is not particularly limited. For example, the target temperature may be a temperature about 20° C. higher than the set temperature, which is the target temperature of the DUT, during high temperature testing, and may be a temperature about 20° C. lower than the set temperature, which is the target temperature of the DUT, during low temperature testing.

The mixer 10 is connected to the downstream side of the flow path $P_5$, and the heated fluid is supplied to the mixer 10 after being heated by the flow path heater 75.

The pulse flow supplier 8 is a mechanism that intermittently supplies a room temperature fluid including compressed dry air at room temperature to the mixer 10. The pulse flow supplier 8 instantaneously changes a temperature of the heated fluid supplied from the continuous flow supplier 7 to the mixer 10 using compressed dry air at room temperature.

The pulse flow supplier 8 has a connector 81, a valve 82, and a pulse flow controller 83. The connector 81 is connected to a CDA (Compressed Dry Air) supply source 400 that supplies compressed dry air. The CDA supply source 400 may include, for example, a compressor that takes in and compresses outside air, and a dryer that dries compressed air. Further, the CDA supply source 400 may be existing factory piping, etc. that can supply compressed dry air.

Since the fluid supplied by the pulse flow supplier 8 is mixed in the mixer 10 with low-temperature nitrogen, etc. supplied from the continuous flow supplier 7, it is preferable to use compressed dry air having a low dew point temperature to prevent dew condensation. Although not particularly limited, the dew point temperature of the compressed dry air under atmospheric pressure is preferably −70° C. or less.

A flow path $P_6$ is connected to the connector 81, and the downstream side of this flow path $P_6$ is connected to the mixer 10. Further, the flow path $P_6$ is provided with the valve 82 that adjusts a flow rate of compressed dry air supplied from the CDA supply source 400. In one or more embodiments, since a normal temperature valve having a high frequency can be used as the valve 82, the flow rate of the compressed dry air can be controlled at high speed.

The pulse flow controller 83 performs PWM control on the valve 82 so that compressed dry air is intermittently supplied. The pulse flow controller 83 calculates a junction temperature Tj of the DUT 100 based on a signal input from the temperature detection circuit 101 of the DUT 100. Then, the pulse flow controller 83 controls the valve 82 so that a deviation between a calculation result of the junction temperature and the target temperature of the DUT 100 becomes small, and controls a flow rate of compressed dry air supplied to the flow path $P_6$. Specific examples of control using junction temperature in this case can include control described in U.S. patent application Ser. No. 15/719,849 (U.S. Patent Application Publication No. 2019/0101587), U.S. patent application Ser. No. 16/351,363 (U.S. Patent Application Publication No. 2020/0033402), U.S. patent application Ser. No. 16/575,460 (U.S. Patent Application Publication No. 2020/0241582), and U.S. patent application Ser. No. 16/575,470 (U.S. Patent Application Publication No. 2020/0241040).

Figure 3:
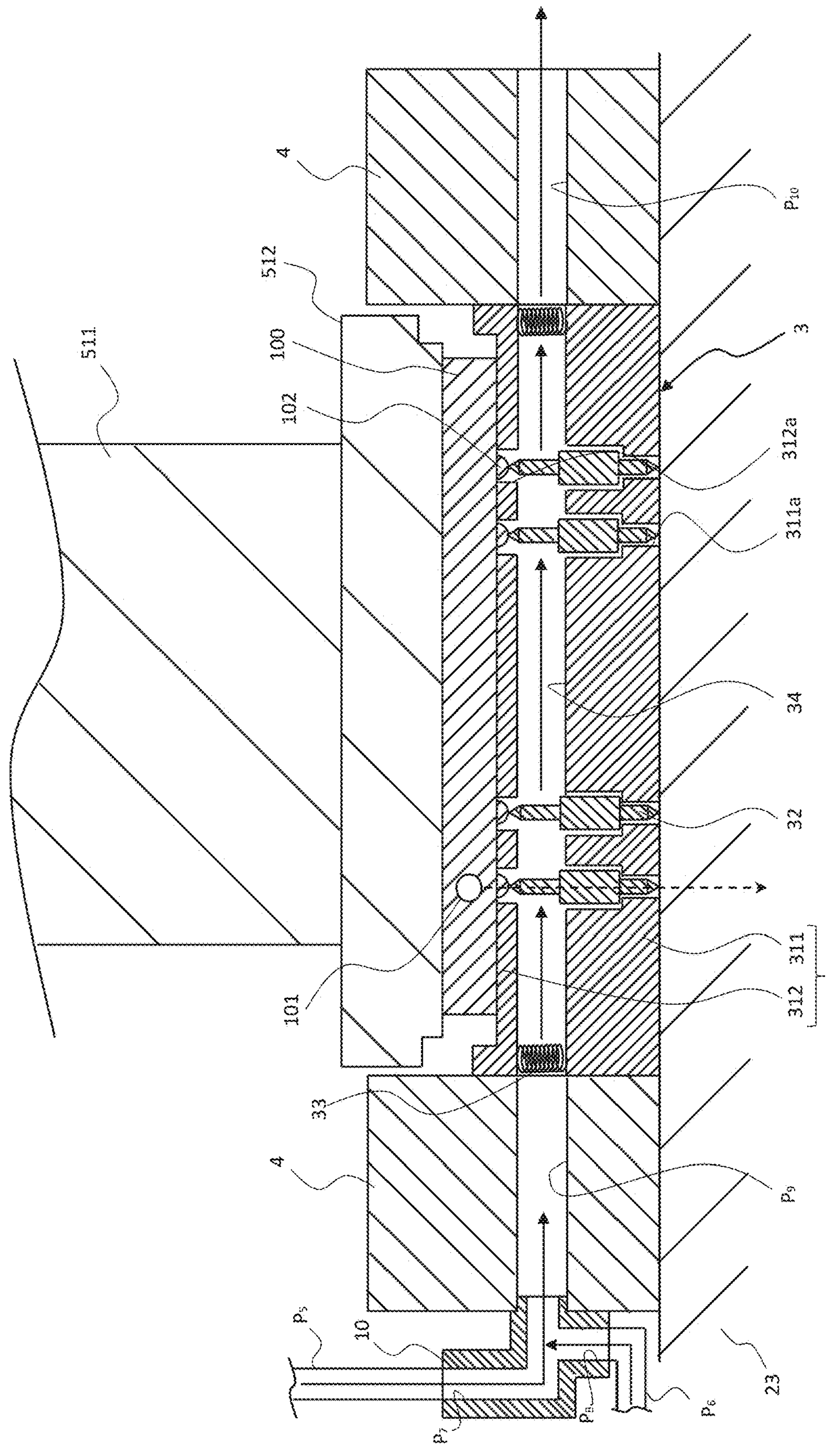
FIG. 3 is a cross-sectional view illustrating an example of a configuration of a socket and a socket guide of the electronic component testing apparatus in one or more embodiments.

FIG. 3 is a cross-sectional view illustrating an example of a configuration near the socket of the electronic component testing apparatus in one or more embodiments. The mixer 10 in one or more embodiments is provided in the socket guide 4. The mixer 10 is a hollow member, and a flow path $P_7$ connected to the flow path $P_5$ of the continuous flow supplier 7 and a flow path $P_5$ connected to the flow path $P_6$ of the pulse flow supplier 8 are formed therein. One end of the flow path $P_5$ is connected to the flow path $P_7$, and in this connection part, a fluid supplied from the continuous flow supplier 7 and a fluid supplied from the pulse flow supplier 8 are mixed.

The flow path $P_7$ of the mixer 10 is connected to a flow path $P_9$ formed inside the socket guide 4. The flow path $P_9$ is connected to the internal space 34 of the socket 3, and a mixed fluid from the mixer 10 is supplied to the internal space 34 via the flow path $P_9$. Further, a flow path $P_{10}$ of the socket guide 4 is connected to the internal space 34, and the mixed fluid that has passed through the internal space 34 is exhausted from the flow path $P_{10}$. Since the mixed fluid in one or more embodiments is a gas, there is no need to recover the exhausted mixed fluid.

The socket 3 in one or more embodiments includes a housing 31, a plurality of contactors 32, a coil spring 33, and the internal space 34. The housing 31 has a base member 311 and a top plate 312. The base member 311 is provided on the test head 23. The base member 311 has a plurality of first holding holes 311*a*.

The top plate 312 is movably supported along a pressing direction of the DUT 100 by the coil spring 33 provided on the base member 311. The top plate 312 is spaced apart from the base member 311, thereby forming the internal space 34 between the base member 311 and the top plate 312. The top plate 312 has a plurality of second holding holes 312*a* provided to face the first holding holes 311*a*.

The contactors 32 are held in the first and second holding holes 311*a* and 312*a*. The contactors 32 are made of metal, etc., and contacts a terminal 102 of the DUT 100 at the second holding holes 312*a*. In this way, the DUT 100 and the test head 23 are electrically connected to each other.

Further, some of the contactors 32 are exposed to the internal space 34 and come into contact with the mixed fluid supplied to the internal space 34. The contactors 32 have high thermal conductivity, and thus function as heat sinks. The mixed fluid supplied to the internal space 34 exchanges heat with the DUT 100 via the contactors 32 to adjust the temperature of the DUT 100.

When executing low temperature testing, the electronic component testing apparatus 1 in one or more embodiments performs temperature adjustment as follows. First, the continuous flow controller 73 opens the valves 72*a*$_1$ and 72*a*$_2$ and maintains the valves 72*a*$_1$ and 72*a*$_2$ open, so that low-temperature nitrogen is continuously supplied to the chamber 52 and the heat exchanger 74. Nitrogen supplied to the heat exchanger 74 is heated by exchanging heat with the atmosphere inside the chamber 52, and then is heated by the flow path heater 75 so that the temperature of nitrogen becomes a temperature approximately 20° C. lower than a set value in the flow path $P_5$. In this instance, since nitrogen is heated by the heat exchanger 74, the amount of heating of nitrogen by the flow path heater 75 can be reduced. Nitrogen heated by the flow path heater 75 is continuously supplied to the mixer 10.

At the same time, the pulse flow controller 83 repeatedly opens and closes the valve 82 by the above-mentioned PWM control, and intermittently supplies compressed dry air to the mixer 10. The compressed dry air is mixed with nitrogen in the mixer 10, thereby increasing the temperature of the mixed fluid, and creating a mixed fluid whose temperature is adjusted around the set temperature. In this manner, in one or more embodiments, the valve 82 is frequently opened and closed by PWM control using the pulse flow controller 83, so that the temperature of the mixed fluid supplied to the socket 3 can be precisely controlled.

On the other hand, when executing high temperature testing, the electronic component testing apparatus 1 in one or more embodiments performs temperature adjustment as follows. First, the continuous flow controller 73 opens the valve 72*b* and maintains the valve 72*b* in the open state, so that room temperature air is continuously supplied to the heat exchanger 74. In this instance, the atmosphere inside the chamber 52 is heated by the chamber heater 92. The air supplied to the heat exchanger 74 is heated by exchanging heat with the atmosphere inside the chamber 52, and then is heated by the flow path heater 75 so that the temperature of the air becomes a temperature approximately 20° C. higher than a set value in the flow path $P_5$. In this instance, since the air is heated by the heat exchanger 74, the amount of heating of the air by the flow path heater 75 can be reduced. The air heated by the flow path heater 75 is continuously supplied to the mixer 10.

At the same time, the pulse flow controller 83 repeatedly opens and closes the valve 82 by the above-mentioned PWM control, and intermittently supplies compressed dry air to the mixer 10. The compressed dry air is mixed with the heated air in the mixer 10, thereby decreasing the temperature of the mixed fluid, and creating a mixed fluid whose temperature is adjusted around the set temperature. In this manner, even when high temperature testing is performed, the valve 82 is frequently opened and closed by PWM control using the pulse flow controller 83, so that the temperature of the mixed fluid supplied to the socket 3 can be precisely controlled.

In the electronic component testing apparatus 1 of one or more embodiments described above, the heat of the atmosphere inside the chamber 52 whose temperature has been adjusted by the chamber temperature adjustment device 9 can be used for the socket temperature adjustment device 6, and thus it is possible to save energy in temperature adjustment. Moreover, a heater having small output can be used as the flow path heater 75, and the size of the flow path heater 75 can be reduced.

In the mixer 10, by mixing a room temperature fluid such as room temperature compressed dry air with a heated fluid such as low-temperature gaseous nitrogen or heated air, it is possible to greatly change the temperature of the mixed fluid in a short time. Therefore, it is possible to speed up temperature adjustment of the DUT.

Furthermore, in the temperature adjustment device 1 of one or more embodiments, the mixed fluid is supplied to the socket 3, and thus the mixed fluid can be supplied to the lower part of the DUT 100 where thermal resistance is low. Therefore, the temperature of the DUT can be efficiently adjusted. In particular, in a resin-molded device, a semiconductor chip is covered with a resin mold having high thermal resistance, and thus it is impossible to efficiently adjust the temperature of the semiconductor chip even when temperature is applied from the resin mold side (upper side). However, by applying temperature from below through the internal space of the socket 3, the temperature of the semiconductor chip can be efficiently adjusted.

In particular, in one or more embodiments, the contactor 32, which has a small heat capacity and high heat conductivity, is used as a heat sink to exchange heat between the mixed fluid and the DUT 100, so that the temperature of the DUT 100 can be efficiently adjusted.

In addition, conventionally, when testing a type of DUT that generates rapid self-heating in a short time, temperature adjustment cannot follow rapid temperature change of the DUT in some cases. However, in the electronic component testing apparatus 1 of one or more embodiments, the temperature of the mixed fluid used for temperature adjustment can be switched at high speed, and thus it is possible to follow rapid temperature change of the DUT 100.

Further, by providing the mixer 10 near the socket 3, a flow path to reach the internal space 34 is shortened, so that an influence of thermal resistance from a flow path of the mixed fluid can be reduced. Therefore, accuracy of temperature adjustment can be improved.

Furthermore, in an electronic component testing apparatus that includes a temperature adjustment device in a contact arm, when a handler has a plurality of contact arms, the number of temperature adjustment devices increases. On the other hand, in the electronic component testing apparatus 1 of one or more embodiments that adjusts the temperature from the socket 3 side, the temperature of the DUT 100 can be adjusted with the minimum number of temperature adjustment devices 6 regardless of the number of contact arms 51.

Note that the embodiments described above are described to facilitate understanding of the invention, and are not described to limit the invention. Therefore, each element disclosed in the embodiments is intended to include all design changes and equivalents that fall within the technical scope of the invention. Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

For example, in the embodiments, low-temperature nitrogen supplied from the $LN_2$ supply source 200 and air supplied from the air supply source 300 are not simultaneously used as the heated fluid. However, the invention is not limited thereto, and a mixed fluid obtained by mixing low-temperature nitrogen and the air may be used as the heated fluid.

Further, in the embodiments, a fluid is heated in the socket temperature adjustment device 6 and then supplied to the mixer 10. However, the invention is not limited thereto. For example, the fluid may be cooled by setting the temperature of the atmosphere inside the chamber 54 to a lower temperature than that of a fluid flowing through the flow path $P_4$ of the heat exchanger 74 depending on the set temperature during testing. Furthermore, the fluid may be cooled by providing a cooler instead of the flow path heater 75.

Further, in the embodiments, the mixer 10 is provided in the socket guide. However, the invention is not limited thereto. For example, the mixer 10 may be provided in the socket.

Figure 4:
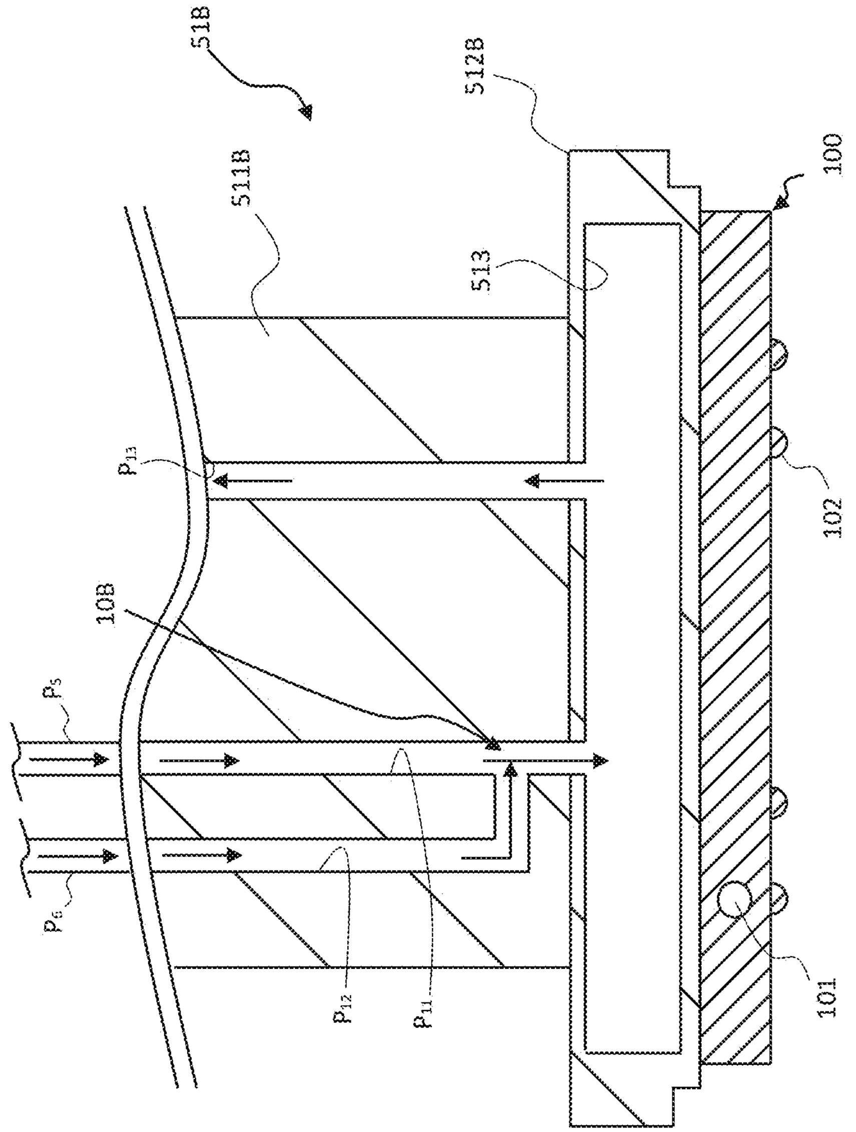
FIG. 4 is a cross-sectional view illustrating an example of a configuration of a contact arm in a modification of one or more embodiments.

Furthermore, in the embodiments, the mixed fluid is supplied to the internal space 34 of the socket 3. However, the invention is not limited thereto. For example, the temperature of the DUT 100 may be adjusted by providing an internal space in the pusher (example of a contact member) 512 of the contact arm 51 and supplying the mixed fluid to the internal space. Such a modification will be described with reference to FIG. 4. FIG. 4 is a cross-sectional view illustrating an example of a configuration of a contact arm in a modification of one or more embodiments.

As illustrated in FIG. 4, a contact arm 51B in the modification further includes flow paths $P_{11}$ to $P_{13}$ and an internal space 513. The flow path $P_{11}$ is connected to the downstream side of the flow path $P_5$ of the continuous flow supplier 7, and is continuously supplied with heated fluid heated by the flow path heater 75. On the other hand, the flow path $P_{12}$ is connected to the downstream side of the flow path $P_6$ of the pulse flow supplier 8, and is intermittently supplied with compressed dry air. The downstream side of the flow path $P_{12}$ joins the flow path $P_{11}$, and the compressed dry air that has passed through the flow path $P_{12}$ is mixed with the heated fluid flowing through the flow path $P_{11}$. In this modification, a junction between the flow path $P_{11}$ and the flow path $P_{12}$ serves as a mixer 10B.

The downstream side of the flow path $P_{11}$ is connected to the internal space 513, and a mixed fluid is supplied to the internal space 513 from the mixer 10B. The mixed fluid supplied to the internal space 513 adjusts the temperature of the DUT 100 by exchanging heat with the DUT 100.

The flow path $P_{13}$ for exhausting the mixed fluid is connected to the internal space 513. The mixed fluid that has exchanged heat with the DUT 100 is discharged to the outside of the handler 5 via the flow path $P_{13}$.

EXPLANATIONS OF LETTERS OR NUMERALS

1 ELECTRONIC COMPONENT TESTING APPARATUS
2 TESTER
21 TESTER MAIN FRAME
22 CABLE
23 TEST HEAD
3 SOCKET
31 HOUSING
  311 BASE MEMBER
    311*a* FIRST HOLDING HOLE
  312 TOP PLATE
    312*a* SECOND HOLDING HOLE
32 CONTACTOR
33 COIL SPRING
34 INTERNAL SPACE
4 SOCKET GUIDE
5 HANDLER
51, 51B CONTACT ARM
  511, 511B ARM
  512, 512B PUSHER
  513 INTERNAL SPACE
52 CHAMBER
6 SOCKET TEMPERATURE ADJUSTMENT DEVICE
7 CONTINUOUS FLOW SUPPLIER
71*a*, 71*b* CONNECTOR
72*a*$_1$, 72*a*$_2$, 72*b* VALVE
73 CONTINUOUS FLOW CONTROLLER
74 HEAT EXCHANGER
  741 MAIN BODY
  742 FIN
75 FLOW PATH HEATER
76 HEATER CONTROLLER
77 TEMPERATURE SENSOR
8 PULSE FLOW SUPPLIER
81 CONNECTOR
82 VALVE
83 PULSE FLOW CONTROLLER
9 CHAMBER TEMPERATURE ADJUSTMENT DEVICE
91 NITROGEN SUPPLY PORT
92 FAN
93 CHAMBER HEATER
10, 10B MIXER
11 TEMPERATURE ADJUSTMENT SYSTEM
$P_1$ to $P_{13}$ FLOW PATHS
J JUNCTION
100 DUT
101 TEMPERATURE DETECTION CIRCUIT
102 TERMINAL
200 $LN_2$ SUPPLY SOURCE
300 AIR SUPPLY SOURCE
400 CDA SUPPLY SOURCE

The invention claimed is:

1. A temperature adjustment system for adjusting a temperature of a device under test (DUT) electrically connected to a socket, the temperature adjustment system comprising:
a first temperature adjustment device that supplies a fluid containing at least a first fluid to an internal space in either the socket or a contact member that contacts the DUT when the DUT is pressed against the socket; and
a second temperature adjustment device that adjusts a temperature of an atmosphere in a chamber of a handler, wherein
the contact member is a pusher that holds the DUT and that is disposed in a contact arm of the handler,
the socket and the pusher are disposed in the chamber,
the first temperature adjustment device comprises a first supplier that supplies the first fluid,
the first supplier comprises:
one or more connectors connected to one or more supply sources that supply the first fluid; and
a heat exchanger disposed between the one or more connectors and the internal space, and
the heat exchanger has a heat exchange part exposed in the chamber and exchanges heat between the first fluid and the atmosphere in the chamber.

2. The temperature adjustment system according to claim 1, wherein
the first supplier further comprises a temperature adjuster that adjusts a temperature of the first fluid from the one or more supply sources via the one or more connectors, and
the heat exchanger is disposed between the one or more connectors and the temperature adjuster.

3. The temperature adjustment system according to claim 2, wherein the first supplier further comprises:
a sensor that measures a temperature of the first fluid on a downstream side of the temperature adjuster; and
a controller that controls the temperature adjuster based on the measured temperature.

4. The temperature adjustment system according to claim 2, wherein the temperature adjuster comprises a heater that heats the first fluid.

5. The temperature adjustment system according to claim 1, wherein the heat exchanger comprises:
fins exposed in the chamber; and
a main body connected to the fins and having a flow path through which the first fluid flows.

6. The temperature adjustment system according to claim 1, wherein the one or more connectors include:

an air supply connector connected to an air supply source of the supply sources; and a nitrogen supply connector connected to a nitrogen supply source of the supply sources that stores liquid nitrogen, the first supplier further comprises: a junction where a first flow path connected to the air supply connector joins a second flow path connected to the nitrogen supply connector, and supplies, as the first fluid, the air from the air supply source, the nitrogen from the nitrogen supply source, or a mixed fluid of the air and the nitrogen.

7. The temperature adjustment system according to claim 1, wherein the one or more connectors include an air supply connector connected to an air supply source of the one or more supply sources, and the first supplier supplies the air from the air supply source as the first fluid.

8. The temperature adjustment system according to claim 1, wherein the one or more connectors include a nitrogen supply connector connected to a nitrogen supply source of the one or more supply sources that stores liquid nitrogen, and the first supplier supplies the nitrogen from the nitrogen supply source as the first fluid.

9. The temperature adjustment system according to claim 1, wherein the fluid further contains a second fluid, the first temperature adjustment device further comprises:

a second supplier that supplies the second fluid having a temperature different from a temperature of the first fluid; and a mixer that mixes the first fluid from the first supplier and the second fluid from the second supplier and supplies the mixed fluid to the internal space.

10. The temperature adjustment system according to claim 9, wherein the second fluid is room temperature air.

11. The temperature adjustment system according to claim 1, wherein the second temperature adjustment device comprises one or both of:

a heating device that heats the atmosphere in the chamber; and a cooling device that cools the atmosphere in the chamber.

12. An electronic component testing apparatus comprising:

the temperature adjustment system according to claim 1;

the socket electrically connected to the DUT;

the contact member that contacts the DUT when the DUT is pressed against the socket; and the chamber in which the socket and the contact member are disposed.

13. The electronic component testing apparatus according to claim 12, wherein the socket comprises:

a contactor electrically connected to a terminal of the DUT; and a housing holding the contactor, the internal space is in the housing, and the contactor is exposed inside the internal space.

* * * * *